United States Patent [19]

Wells et al.

[11] Patent Number: 4,698,509

[45] Date of Patent: Oct. 6, 1987

[54] HIGH SPEED PATTERN GENERATOR FOR ELECTRON BEAM LITHOGRAPHY

[75] Inventors: William D. Wells, Ipswich; David M. Robinson, Wakefield; Richard M. DeLuca, Danvers; Eric D. Burwen, Methuen, all of Mass.

[73] Assignee: Varian Associates, Inc., Palo Alto, Calif.

[21] Appl. No.: 701,711

[22] Filed: Feb. 14, 1985

[51] Int. Cl.⁴ .............................................. G21K 5/04
[52] U.S. Cl. .................................. 250/492.2; 250/398
[58] Field of Search ............ 250/492.2, 492.3, 396 R, 250/398, 400, 492.22, 492.23

[56] References Cited

U.S. PATENT DOCUMENTS

| | | | |
|---|---|---|---|
| 3,900,737 | 8/1975 | Collier et al. | 250/492.2 |
| 4,145,597 | 3/1979 | Yasuda | 219/121 EB |
| 4,147,937 | 4/1979 | Buelow et al. | 250/492.2 |
| 4,151,422 | 4/1979 | Goto et al. | 250/492.2 |
| 4,258,265 | 3/1981 | Sumi | 250/492.2 |
| 4,291,231 | 9/1981 | Hawashima et al. | 250/492.2 |
| 4,387,433 | 6/1983 | Cardenia et al. | 364/200 |
| 4,393,312 | 7/1983 | Collier et al. | 250/492.2 |
| 4,469,950 | 9/1984 | Taylor et al. | 250/492.2 |

FOREIGN PATENT DOCUMENTS 0012075 1/1979 Japan ................................. 250/492.3

OTHER PUBLICATIONS

Proc., Electron and Ion Beam Science and Technology, 8th Int. Conf., pp. 117-134; 9th Int. Conf., pp. 98-111.

Primary Examiner—Carolyn E. Fields
Assistant Examiner—Paul A. Guss
Attorney, Agent, or Firm—William R. McClellan; Stanley Z. Cole; Gerald M. Fisher

[57] ABSTRACT

A pattern generator for supplying beam deflection and blanking signals in an electron beam lithography system which writes polygon pattern features by sweeping a beam of rectangular cross-section over each polygon and simultaneously varying the length of the rectangular cross-section. The pattern generator converts polygon size and shape data to an upper shape signal and a lower shape signal. The shaping signals are subtracted to provide a beam length signal. The lower shape signal controls the beam position during writing of the polygon. The pattern generator further includes a ramp generator for sweeping the beam over the polygon. The ramp signal and shaping signals are synchronized by detecting the points in the sweep at which polygon turn points occur. The shape signal generators utilize interleaved operation for high speed. A blanking circuit provides uniform exposure of pattern features by controlling the width of the rectangular beam. The beam is ramped on and off at a rate which matches the rate of the sweep signal.

19 Claims, 26 Drawing Figures

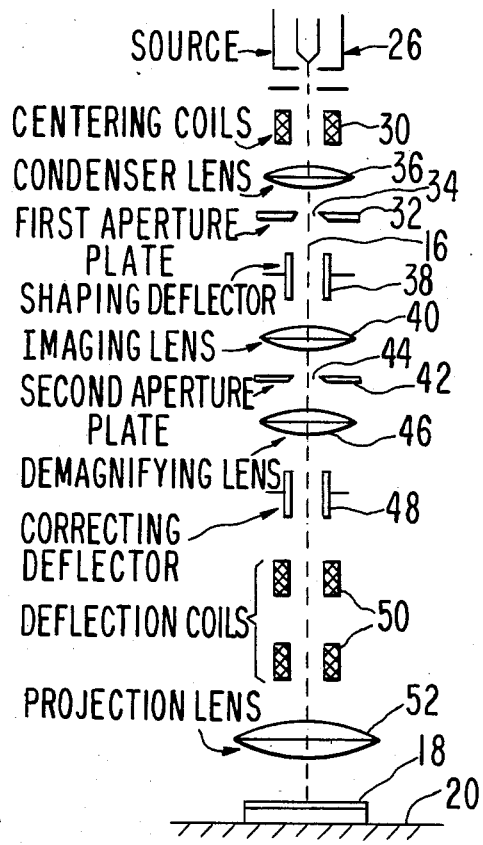
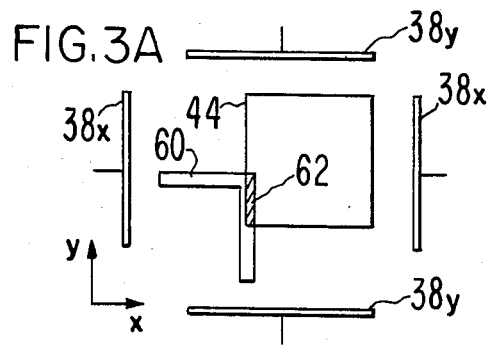
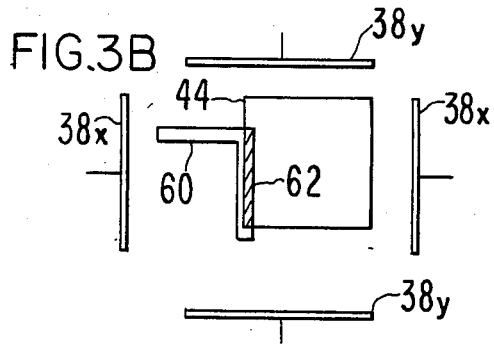
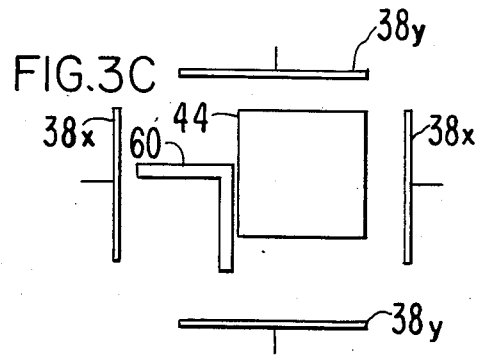
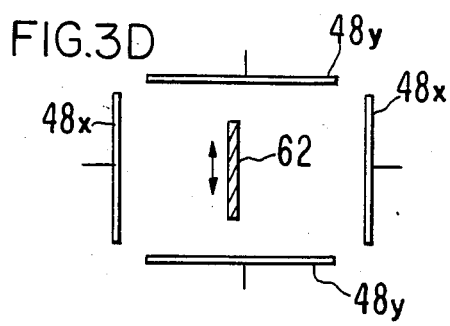

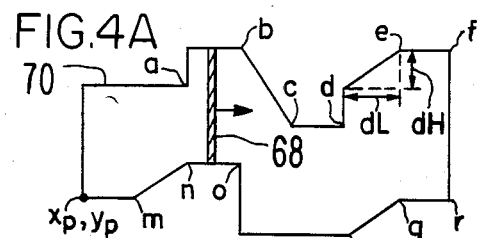
FIG.4A
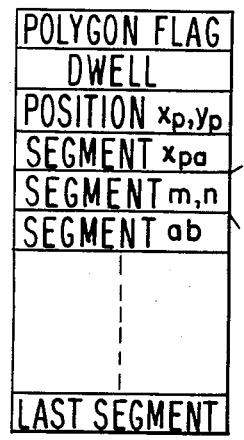
FIG.4K
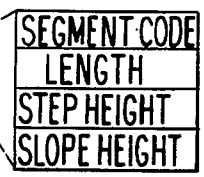
FIG.4B — LINE LENGTH
FIG.4C — LINE POSITION (LOWER SHAPE)
FIG.4D — UPPER SHAPE
FIG.4E — BLANKING
FIG.4F — TIMING RAMP
FIG.4G — UPL
FIG.4H — UP TURNPT
FIG.4I — LOL
FIG.4J — LO TURNPT

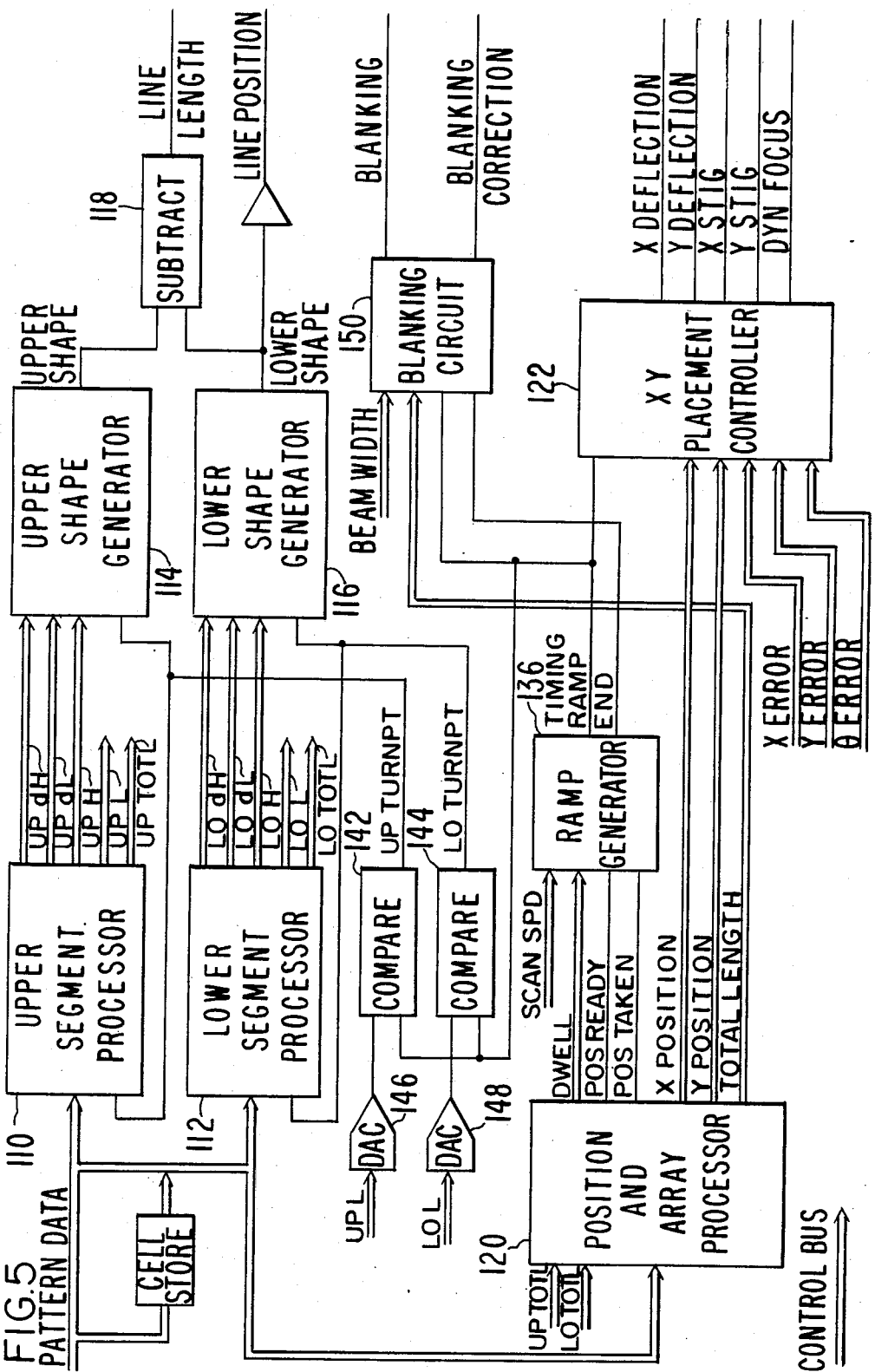

HIGH SPEED PATTERN GENERATOR FOR ELECTRON BEAM LITHOGRAPHY

BACKGROUND OF THE INVENTION

This invention relates to control apparatus for electron beam lithography systems and, more particularly, to control apparatus for high speed pattern generation in a system utilizing variable length line scanning.

Electron beam exposure systems are used commercially for selectively irradiating a resistcoated workpiece to define the features of a semiconductor device. The workpiece can be a mask plate or can be a resist-coated semiconductor wafer in which features are defined directly. In either case, an electron beam is controlled in a highly accurate, high speed manner to expose complex microminiature patterns in the electron resist material. The minimum feature dimensions can be less than one micrometer. As semiconductor devices with greater complexity are developed, the desire is to reduce pattern dimensions even further.

In order to expose these microminiature patterns, the electron beam is focused and shaped to the required dimension and applied to the electron-sensitive resist. In addition, the beam is deflected to prescribed pattern locations on the workpiece. A variety of shaping and deflection techniques have been utilized. A small Gaussian spot beam can be raster-scanned over the entire surface of the workpiece and turned on or off to produce a desired pattern. A system using this approach is disclosed in U.S. Pat. No. 3,900,737, issued Aug. 19, 1975, to Collier et al. Alternatively, the spot beam can be directed to desired pattern areas and scanned only over those pattern areas in a vector scanning approach. Either approach is relatively slow, since the area covered by the spot beam at any instant is extremely small. In another system, the electron beam is shaped into rectangles of variable shape and size. Successive areas of the pattern are flash exposed with the rectangular beam. One drawback of variable shaped rectangle systems is the difficulty in exposing angled or odd shaped pattern features.

A technique known as variable line scanning has been developed to provide high speed operation and the capability to easily expose arbitrarily shaped pattern features. A beam having a rectangular cross-section is scanned in a direction perpendicular to its long dimension. As the beam is scanned, the length of the rectangle is varied to define a desired pattern feature. In producing a variable shaped beam, an image of a first aperture is focused on a second square aperture. The first aperture can be square or L-shaped. Shaping deflectors dynamically position the image of the first aperture relative to the second aperture so as to provide a beam cross-section of the desired length and width. Additional deflectors position the beam on the workpiece and scan the rectangular beam in the desired direction.

As integrated circuits become more complex, the number of devices per chip increases; and the size of the individual devices is decreased. In writing device patterns with an electron beam exposure system, each device is broken down into a number of elementary shapes, such as rectangles and trapezoids, which can be easily described and which are more easily written by the electron beam system. However, this breaking up of pattern features increases the number of individual features to be written by the system. Furthermore, due to the proximity effect resulting from backscattering of electrons in the resist material, it is common to partition pattern features into subfeatures and to expose the subfeatures with variable dosage depending on their size and proximity to other pattern features. This results in a still further increase in the number of individual pattern features to be exposed by the system. The result is that an integrated circuit device may require on the order of a million or more individual pattern features. Such a pattern represents only one of several pattern layers in the complete integrated circuit device. Therefore, the speed at which individual pattern features are exposed by the system is a matter of utmost importance in commercial semiconductor processing. In addition, the accuracy of the patterns must be maintained in order to insure proper operation of the complex devices.

The data representing each of the pattern features is typically stored in digital form on a mass storage device, such as a magnetic disc or tape, and is read as required by the electron beam exposure system. The digital data must be converted to analog signals for energizing the shaping and deflection elements of the electron beam column. In order to achieve high speed lithographic writing in a system utilizing variable line scanning, the conversion of digital data to analog signals must be performed in an efficient and high speed manner.

It is a general object of the present invention to provide novel apparatus for performing charged particle beam lithography.

It is another object of the present invention to provide novel apparatus for high speed variable line scan charged particle beam lithography.

It is yet another object of the present invention to provide apparatus for controlling the beam shape and beam position in a charged particle beam lithography system.

It is still another object of the present invention to provide novel apparatus for converting data representing location, size and shape of polygon features into signals for controlling the shape and position of a charged particle beam.

SUMMARY OF THE INVENTION

According to the present invention, these and other objects and advantages are achieved in apparatus for controlling charged particle beam irradiation of a workpiece for high speed writing of a polygon represented by data specifying a polygon location, size and shape. The apparatus comprises means for generating a charged particle beam having a rectangular cross-section including means for varying the cross-section and position of the rectangular beam, means for converting the polygon location data to deflection voltages for positioning the rectangular beam at the polygon location and means for generating a ramp signal for sweep deflection of the rectangular beam over the polygon. The apparatus further includes means for converting the polygon size and shape data to shaping signals for dynamically varying the cross-section and position of the rectangular beam during sweep deflection in accordance with the size and shape of the polygon so that the beam uniformly irradiates an area of the workpiece having the location, size and shape of the polygon.

According to another aspect of the present invention, there is provided apparatus for high speed charged particle beam lithography exposure of a polygon pattern feature at a prescribed location on a workpiece, the polygon comprising a plurality of interconnected turn points. The apparatus comprises means for generating a charged particle beam having a rectangular cross-section including means for varying the length and position of the rectangular beam, means for generating x, y position signals for positioning the rectangular beam at an initial polygon location and means for generating a ramp signal for sweep deflection of the rectangular beam over the polygon. The apparatus further includes means for generating shaping signals for controlling the length and position orthogonal to the sweep direction of the rectangular beam during sweep deflection of the rectangular beam over the polygon, means for generating successive turn point voltages representing the location of the next turn point as the rectangular beam is swept over the polygon and means for generating turn point control signals for controlling the shaping signal means each time the ramp signal equals a turn point voltage.

According to yet another aspect of the present invention, there is provided apparatus for high speed charged particle beam lithography exposure of a polygon pattern feature at a prescribed position on a workpiece comprising a charged particle beam column including means for forming a charged particle beam having a rectangular cross-section, first means responsive to a first shaping signal for varying the length of the rectangular beam, second means responsive to a second shaping signal for high speed positioning of the rectangular beam during exposure of a polygon and third means responsive to positioning signals for large scale positioning and sweeping of the rectangular beam on the workpiece. The apparatus further includes means for generating the positioning signals including means for generating the polygon position signals and means for generating a sweep signal for sweeping the rectangular beam over the area of the polygon. The apparatus still further includes means for generating the first and second shaping signals synchronized with the sweep signal including means for generating an upper shape signal corresponding to the upper shape of the polygon, means for generating a lower shape signal corresponding to the lower shape of the polygon and means for obtaining the difference between the upper and the lower shape signals, the first shaping signal corresponding to the difference and the second shaping signal corresponding to one of the shape signals.

According to still another aspect of the present invention, there is provided apparatus for high speed charged particle beam lithography exposure of a polygon pattern feature on a workpiece. The apparatus comprises means for generating a charged particle beam having a rectangular cross-section including means for varying the length, width and position of the rectangular beam, means for generating a ramp signal for sweep deflection of the rectangular beam over the polygon at a selectable sweep rate and means for generating shaping signals for controlling the length and position orthogonal to the sweep direction of the rectangular beam during sweep deflection of the rectangular beam over the polygon. The apparatus further includes means for generating an unblanking signal for providing substantially uniform exposure within the polygon by controlling the width of the rectangular beam during the sweep deflection. The unblanking means comprises clamping circuit means for increasing the beam width at the sweep rate of the ramp signal until the desired beam width is reached, for maintaining the beam width until the rectangular beam reaches the end of the polygon, and for decreasing the beam width at the sweep rate of the ramp signal until the beam width reaches zero.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 2 is a schematic diagram of an electron beam column for use in the electron beam system of FIG. 1;

FIGS. 3A–3D illustrate the shaping of an electron beam to form a rectangle of variable length;

FIGS. 4A–4K illustrate the data and waveforms associated with exposure of a pattern feature with the system of FIG. 1;

FIG. 5 is a block diagram of the pattern generator of FIG. 1;

DETAILED DESCRIPTION OF THE INVENTION

Figure 1:
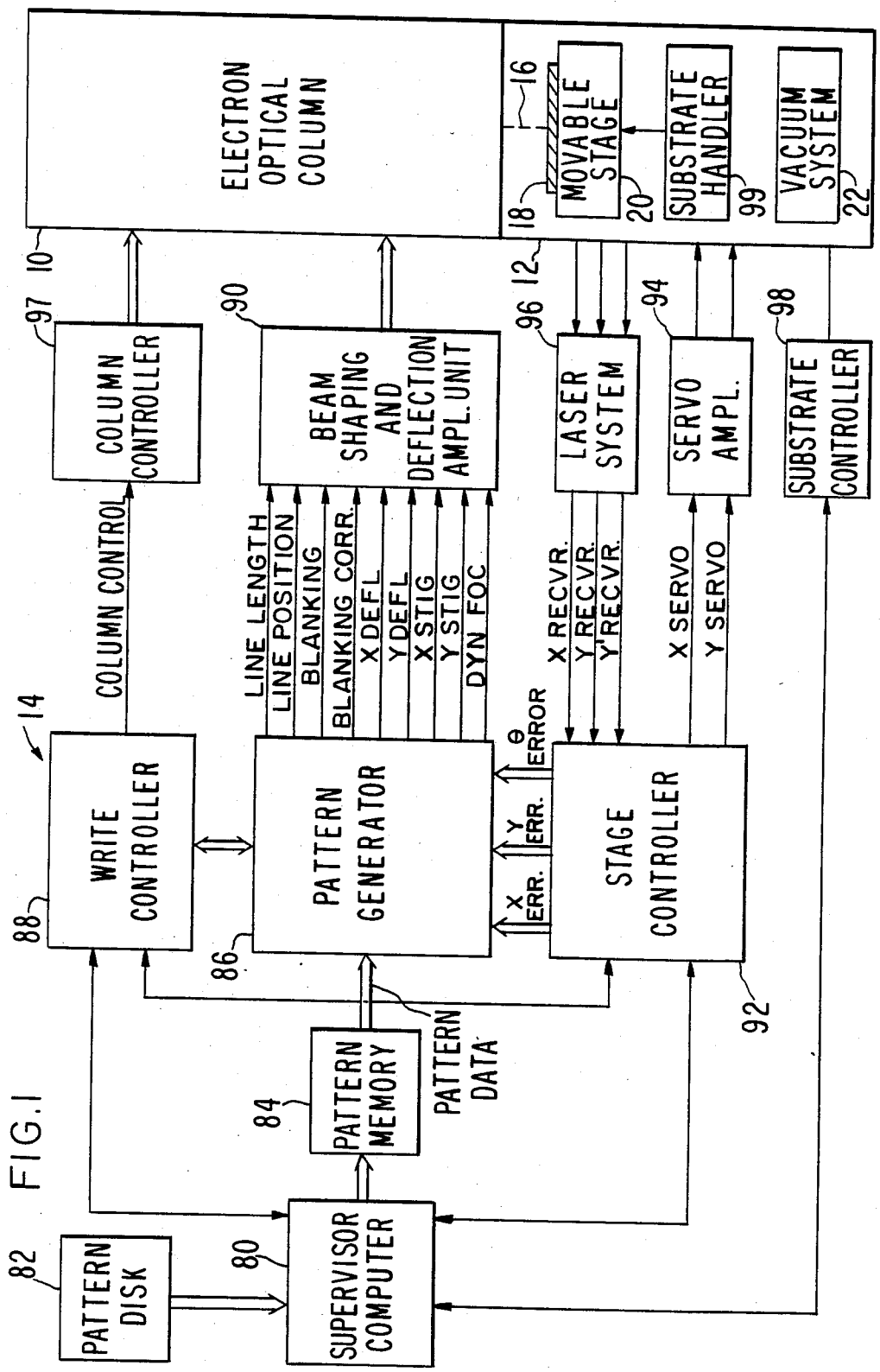
FIG. 1 is a simplified block diagram of an electron beam lithography system in accordance with the present invention.

A simplified block diagram of an electron beam lithography system is shown in FIG. 1. A schematic diagram of the electron beam column is shown in FIG. 2. The system includes an electron optical column 10, a base assembly 12 and a control system shown generally at 14. The output of the column 10 is a finely focused electron beam 16, which is applied to the surface of a workpiece 18. The workpiece 18 is typically a resist-coated semiconductor wafer or mask plate and is mounted on a stage 20 in the base assembly 12. The stage 20 is movable in the x, y directions perpendicular to the electron beam 16. The combination of movement by the stage 20 and deflection of the electron beam 16 permits the entire surface of the workpiece 18 to be exposed by the electron beam 16. It will be understood that the region traversed by the electron beam 16 between the electron source and the workpiece 18 is maintained at high vacuum by a vacuum system 22.

Referring to FIG. 2, the electron beam column 10 includes an electron source 26 which emits the electron beam 16 along the axis of the column 10. The electron beam 16 passes through centering coils 30 which precisely align the electron beam with the axis of the column 10 and illuminates a first aperture plate 32 having a first aperture 34 therethrough. The beam 16 is focused by a condensor lens 36 to provide an image of the source 26 between the plates of a shaping deflector 38. The beam 16 then passes through an imaging lens 40 which focuses an image of the first aperture 34 onto a second aperture plate 42 having a second aperture 44 therethrough. The shaping deflector 38 operates to deflect the image of the first aperture 34 relative to the second aperture 44, so as to provide a beam having a cross-section suitable for variable line scanning, as described in detail hereinafter. In addition, the beam 16 is blanked off by the shaping deflector 38. The electron beam 16 then passes through a demagnifying lens 46, a correcting deflector 48, deflection coils 50 and a projection lens 52. The demagnifying lens 46 and the projection lens 52 demagnify the beam 16 to its final size and project an image of the shaped beam onto the workpiece 18. The deflection coils 50 operate to deflect the shaped beam to any specified position within a prescribed scan field on the workpiece 18. The correcting deflector 48 provides very high speed electrostatic deflection of the beam 16 over short distances. It will be understood that each of the deflection elements 38, 48, 50 have the capability to deflect the electron beam 16 in the x, y directions perpendicular to the axis of the beam.

The operation of the first aperture 34, which can be L-shaped or square, the second aperture 44 and the shaping deflector 38 to provide beam shaping is illustrated in FIGS. 3A and 3B. The operation of the same elements to provide beam blanking is illustrated in FIG. 3C. In FIG. 3A, the shaping deflectors 38x deflect the beam in the x direction, while the shaping deflectors 38y deflect the beam in the y direction, by the application of appropriate voltages thereto. Each of the FIGS. 3A–3C depicts the superposition of an image 60 of the L-shaped first aperture 34 and the second aperture 44. The relative positions of the first aperture image 60 and the second aperture 44 are determined by the voltages applied to the shaping deflectors 38x, 38y. The portion of the electron beam 16, which passes through second aperture 44, is determined by the amount of overlap between the second aperture 44 and the first aperture image 60 and has a cross-section in the form of an intermediate line 62 of variable length and width, as indicated by the cross-hatched areas in FIGS. 3A and 3B. FIG. 3B illustrates the shaping of the beam 16 to provide a vertical line 62 of nearly maximum length In FIG. 3A, the shaping deflector 38y has moved the first aperture image 60 downward, thereby shortening the vertical line 62. Thus, it can be seen that the voltage applied to the y-shaping deflector 38y determines the length of the shaped beam. The maximum length is determined by the dimensions of the apertures 34, 44. FIG. 3C illustrates blanking of the beam when the first aperture image 60 and the second aperture 44 have no overlapping area. This is most easily accomplished by applying an appropriate voltage to the x direction shaping deflector 38x to deflect the first aperture image 60 to the left. It will be understood that by positioning the other leg of the L-shaped first aperture image 60, in relationship to the bottom edge of the second aperture 44, a horizontal line can be obtained. An image of the intermediate line 62 is projected by the demagnifying lens 46 and the projection lens 52 onto the surface of the workpiece 18 to provide a projected line 68, as shown in FIG. 4A. The projected line 68 can have a vertical or a horizontal orientation and is variable in length up to a maximum length $l_m$, typically, three micrometers. It will be understood that the term "line," as used in connection with the line 62 or the line 68, refers to the rectangular cross-sectional shape of the electron beam 16.

The exposure of a pattern 70 in the shape of a polygon, by scanning of the variable length line 68, is illustrated in FIG. 4A. It is assumed that the pattern 70 is no greater in vertical dimension than the maximum length $l_m$ of the line 68 and that the pattern 70 does not cross a scanfield boundary (the area which can be scanned by deflection of the electron beam 16 without movement of the workpiece). Initially, the beam 16 is shaped as illustrated in FIG. 3A and is positioned by the deflection coils 50 at the left edge of the pattern 70. The line 68 is then scanned to the right at a constant speed by the application of a steadily increasing, or ramped, current to the deflection coils 50, as shown in FIG. 4F. Simultaneously, a LINE LENGTH signal illustrated in FIG. 4B is applied to the shaping deflector 38y; and a LINE POSITION signal illustrated in FIG. 4C is applied to the y direction correcting deflector 48y. The LINE LENGTH signal is operative to increase or decrease the length of the line 68, as required to expose the pattern 70. The LINE POSITION signal is operative to shift the entire line 68 up or down as required by the pattern 70. The necessity for the LINE POSITION signal can be understood by noting that the lower end of the intermediate line 62 remains stationary in FIGS. 3A and 3B. Thus, the entire line must be shifted in the y direction, as shown in FIG. 3D, to generate the lower edge of the pattern 70. When the line 68 reaches the right edge of the pattern 70, it is blanked off, as illustrated in FIG. 3C; and the beam 16 is shifted to the next pattern to be scanned. When the pattern 70 crosses a scanfield boundary or has a dimension perpendicular to the direction of scan greater than the maximum length of the line 68, two or more scans are required to complete the pattern 70.

The above description relates to the exposure of a single pattern feature. The exposure of a complete level of a semiconductor wafer or of a mask plate requires exposure of many thousands of such features in an accurate and high speed manner. Data representing pattern features must be converted to signals for controlling the electron beam column. In addition, the movable stage must position the area of the workpiece being exposed within the deflection field of the electron beam. Referring again to FIG. 1, the operation of the system is under control of a supervisor computer 80. Pattern data in a format compatible with high speed writing is stored on a pattern disc 82. Data representing each individual pattern feature to be written on the workpiece includes an x, y location of the feature and a complete description of the pattern feature, as described in more detail hereinafter When a workpiece is to be exposed, the appropriate set of pattern data is transferred by the supervisor computer 80 from the pattern disc 82 to a high speed pattern memory 84. The pattern data is transferred serially from the pattern memory 84, one pattern feature at a time, to a pattern generator 86. Pattern generator 86, under the direction of a write controller 88, converts the pattern data to analog signals for controlling the electron beam column 10. The signals generated by the pattern generator 86 are converted to the appropriate voltage and current levels by a beam shaping and deflection amplifier unit 90 located in close proximity to the electron optical column 10. The pattern generator 86 receives control signals from the write controller 88 and stage error signals from a stage controller 92. The stage controller 92 controls the x, y position of the stage 20 through a servo amplifier unit 94 and monitors the actual position of the stage 20 through a highly accurate laser interferometer system 96. Errors between required position and actual position are supplied to the pattern generator 86. The write controller 88 also controls electron optical column 10 parameters, which remain stationary during writing, through a column controller 97. The column controller 97 controls components of the column 10 such as the electron source, centering coils and lenses. The base assembly 12 includes a substrate handler 99 which exchanges workpieces after completion of processing. The substrate handler 99 is controlled by the supervisor computer 80 through a substrate controller 98.

A block diagram of the pattern generator 86 is shown in FIG. 5. The analog signal outputs for a vertical line swept horizontally are as follows. The LINE LENGTH signal energizes the y-axis shaping deflector 38y to control the length of the shaped electron beam, as shown in FIGS. 3A and 3B. The LINE POSITION signal controls the y-axis correcting deflector 48y to move the y-position of the lower end of the electron beam, as shown in FIGS. 3D, 4A and 4C. A BLANKING signal (FIG. 4E) controls the x-axis shaping deflector 38x to accomplish beam blanking, as shown in FIG. 3C. The beam is unblanked during writing of pattern features and is blanked during the time when the beam is being shifted to the location of a new pattern feature. The beam can be increased gradually in width at the beginning and end of pattern features to improve exposure uniformity by utilizing a ramped BLANKING signal. A BLANKING CORRECTION signal is applied to the x-axis correcting deflector 48x to provide a second order correction during the ramped-on and ramped-off BLANKING signal. An X-DEFLECTION signal applied to the x-axis deflection coils 50 positions the beam at the initial x-axis location of the pattern feature and then sweeps the line beam across the pattern feature at a prescribed sweep rate. A Y-DEFLECTION signal applied to the y-axis deflection coils 50 positions the beam at the y-axis location on the workpiece of the pattern feature.

For a horizontal line swept vertically, the LINE LENGTH signal energizes the x-axis shaping deflector 38x and the LINE POSITION signal energizes the x-axis correction deflector 48x. Likewise, the BLANKING signal is applied to the y-axis shaping deflector 38y, the BLANKING CORRECTION signal is applied to the y-axis correcting deflector 48y, and the y-axis deflection coils 50 sweep the horizontal line vertically.

Pattern data describing a particular level of the device being written by the electron beam system is generated by a CAD system utilizing known techniques. The data is then processed by computer to perform sizing, overlap removal, fracturing of data for proximity effect correction and optimizing the data for high speed writing. The workpiece is typically exposed by the electron beam system by moving the stage continuously back and forth in a serpentine pattern and exposing parallel abutting stripes on the workpiece. The width of the stripe corresponds to the deflection field of the electron beam, typically 1.6 millimeters, while the length of the stripe depends on the dimension of the workpiece. To simplify data organization, each stripe is subdivided into substripes having one dimension equal to the width of the stripe (1.6 millimeters) and the other dimension, typically 100 micrometers. The pattern features within each substripe are exposed sequentially. Substripes are sequentially exposed as the stage moves the workpiece along the stripe.

The pattern features in each substripe are defined by the pattern data as follows. Identifier words and flags are omitted for simplicity. For each substripe, there is specified an x, y substripe location on the workpiece and a description of each polygon, array and cell comprising the pattern within the substripe. Polygons are the basic pattern features. For each polygon, there is specified a dwell, an x,y position, $x_p$, $y_p$, and a number of segments which define the polygon, as shown in FIG. 4K. The dwell indicates the sweep rate for the particular polygon and, therefore, the exposure level. The segments making up the polygon can be understood with reference to FIG. 4A. The polygon 70 is defined in the pattern data as a series of interconnecting upper segments ($x_p$a, ab, bc, cd, de, ef) and a series of interconnecting lower segments (mn, no, op, pq, qr). Adjoining segments meet at a turn point. The segment $x_p$m is not defined in the data, since no shaping or repositioning of the beam is required. For each segment in the polygon, the pattern data includes a segment code, a length, a step height and a slope height as shown in FIG. 4K. The segment code indicates whether the particular segment is on the upper or lower part of the polygon and whether a step height and a slope height are included. Either the step height or the slope height, or both, can be zero. There are, therefore, four basic segment types: (1) a horizontal line (such as segment no); (2) a vertical step followed by a horizontal line (such as segment ab); (3) a sloped line (such as segment mn); and (4) a vertical step followed by a sloped line (such as segment de). This data is specified for each polygon to be written on the workpiece.

To reduce data storage requirements when patterns are repetitive, cell and array capabilities are provided. A cell is one or more polygons which can be specified by a cell-call command in the substripe data. An array is used to specify a repetitively-used cell. The data specifying the array includes delta x and delta y, the spacings in the x and y directions between the repetetively used cells; number x and number y, the number of repetitions in the x and y directions; and cell-call, which specifies the particular cell to be used.

The pattern generator 86, for converting pattern data into analog signals for energizing the electron beam column 10, is shown in FIG. 5. The pattern data is supplied serially, one byte at a time, to an upper segment processor 110 and to a lower segment processor 112. In addition, a control bus from the write controller 88 supplies set-up and control signals, such as scan speed, beam width, etc., to various parts of the pattern generator 86. The control bus is generally inactive during exposure of polygons. The segment processors 110, 112 convert the pattern data to the form required by the analog circuitry. In addition, the segment processors 110, 112 act as data rate buffers between the pattern data stream and the analog signals. The pattern data is supplied in bursts from the pattern memory 84 according to a regular clock rate, while the analog signals are supplied asynchronously to the electron beam column 10 in accordance with prescribed sweep rates. The average rates of the pattern data and the analog signals must be the same to insure continuous writing. The upper segment processor 110 accepts upper segment data (data describing the upper edge of the polygon) from the pattern data stream, while the lower segment processor 112 accepts lowers segment data (data describing the lower edge of the polygon) from the pattern data stream. The upper segment processor 110 provides data including upper height (UP H), upper slope height (UP dH) and upper segment length (UP dL) to an upper shape generator 114. The lower segment processor 112 provides data including lower height (LO H), lower slope height (LO dH) and lower segment length (LO dL) to a lower shape generator 116.

The upper shape generator 114 converts the input data to an UPPER SHAPE signal (FIG. 4D) representing the upper edge of the polygon being written, while the lower shape generator 116 converts the input data to a LOWER SHAPE signal (FIG. 4C) representing the lower edge of the polygon being written. The LINE LENGTH signal, used to control the length of the line beam during sweeping of a polygon, is supplied by a subtract circuit 118 which calculates the difference between the UPPER SHAPE signal and the LOWER SHAPE signal. The LINE POSITION signal, used to control the fine position of the line beam so as to follow the lower edge of the polygon, is the same as the LOWER SHAPE signal with appropriate amplification.

The pattern data is also supplied to a position and array processor 120 which acts as a data rate buffer between the pattern data stream and the analog signals controlling the electron beam x, y position. In addition, the position and array processor 120 controls the positioning of the elements of arrays, as described hereinafter. The position and array processor 120 provides data representing the x-position and y-position of each polygon, the dwell, or sweep rate, and the total length of each polygon.

The x-position and y-position signals are supplied to an xy placement controller 122. The xy placement controller 122 receives an X ERROR signal, a Y ERROR signal and a θ ERROR signal from the stage controller 92. When the electron beam has been positioned at the initial point $x_p$, $y_p$ (FIG. 4A) of the polygon, a POSITION READY signal is supplied by the position and array processor 120 to a ramp generator 136. The ramp generator 136 generates a TIMING RAMP, as shown in FIG. 4F, which controls the scanning, or sweeping, of the electron beam across the polygon being written. The TIMING RAMP is supplied to the x-axis deflection circuit or the y-axis deflection circuit in the xy placement controller 122, depending on whether the polygon is to be scanned horizontally or vertically. The xy placement controller 122 provides X-DEFLECTION and Y-DEFLECTION signals to the deflection coils 50 in the electron beam column 10. In addition, the xy placement controller 122 provides X STIG and Y STIG signals to stigmator coils and a DYN FOCUS signal to a dynamic focus coil in the column 10.

The TIMING RAMP is also supplied to one input of a compare circuit 142 and to one input of a compare circuit 144. Data representing upper length (UP L) is supplied by the upper segment processor 110 through a DAC 146 to the other input of the compare circuit 142. Data representing the lower length (LO L) is supplied by the lower segment processor 112 through a DAC 148 to the other input of the compare circuit 144. UP L and LO L are the cumulative length of the polygon in the direction of scan and indicate the position at which each turn point occurs. UP L and LO L are incremented by the respective next segment length after each segment is completed, as shown in FIGS. 4G and 4I. The compare circuits 142, 144 compare the TIMING RAMP with the analog values of UP L and LO L, respectively. When the TIMING RAMP voltage equals UP L or LO L, turn point pulses UP TURNPT and LO TURNPT are generated, as indicated in FIGS. 4H and 4J. The turn point pulses clock data representing new segments to the outputs of the segment processors 110, 112 and into the shape generators 114, 116, so that writing of the next segment can proceed without interruption. It will be understood that turn points do not necessarily occur at the same position along the upper and lower edges of the polygon.

The TIMING RAMP from the ramp generator 136 and a TOTAL LENGTH signal from the position and array processor 120 are supplied to a blanking circuit 150 which generators BLANKING and BLANKING CORRECTION signals. These signals insure that the beam is unblanked only during writing of polygons, as described hereinafter.

Figure 6:
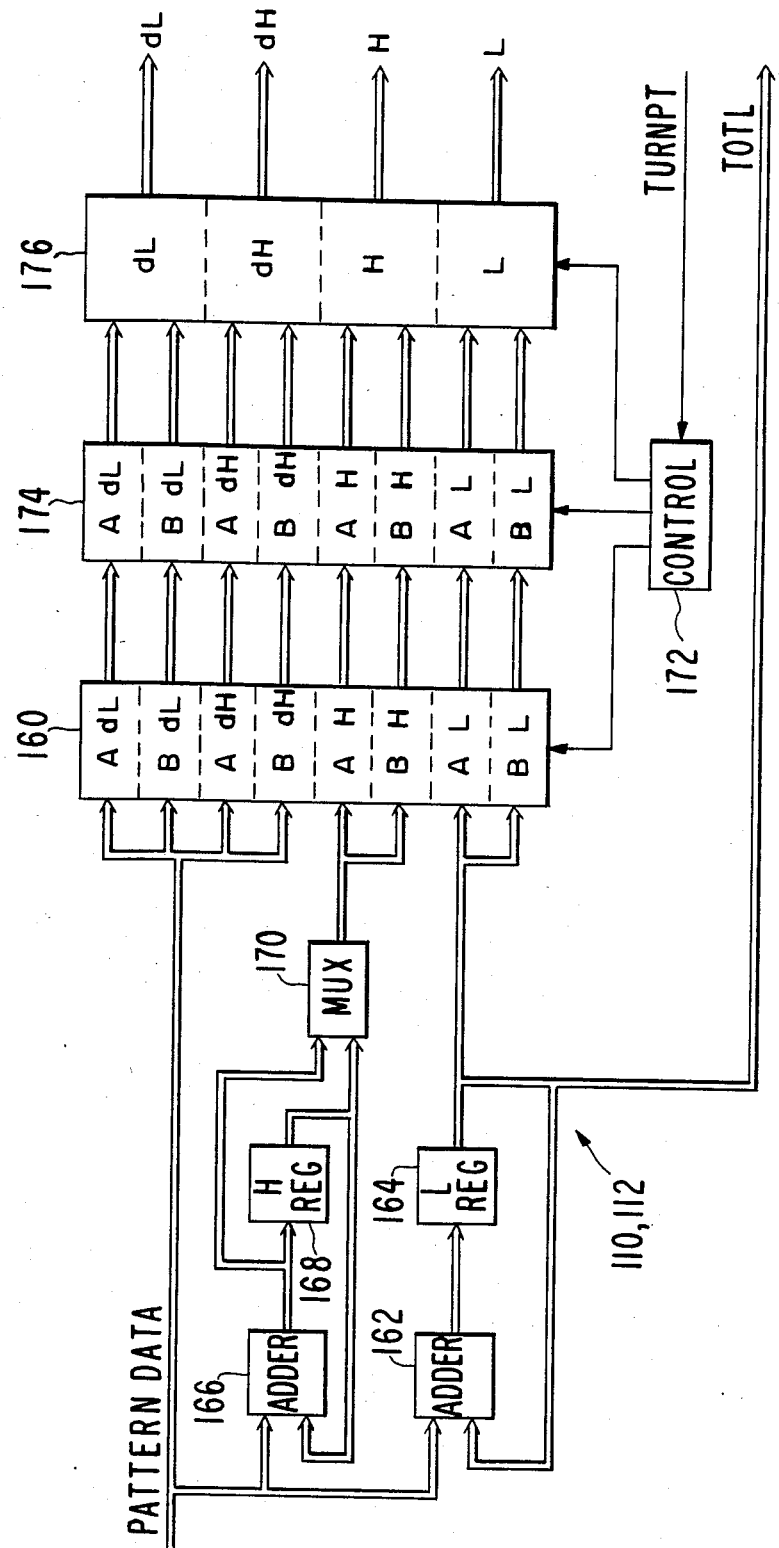
FIG. 6 is a block diagram of the segment processor shown in FIG. 5.

Referring now to FIG. 6, there is shown a block diagram of the segment processors 110, 112. The major component of the segment processor is a first-in first-out (FIFO) buffer register 160 which stores the segment data required to describe a polygon. The segment processor receives pattern data, performs necessary processing of the pattern data and stores the processed data in the FIFO 160. The segment data for a particular polygon is processed and stored in the FIFO 160 before writing of the polygon is begun. The FIFO 160, as shown in FIG. 6, is subdivided into regions for storing segment length dL, slope height dH, height H and length L. Each region is further subdivided into A and B sections for high speed parallel operation as described hereinafter. Segment length (dL) data, representing the length of a segment, and slope height (dH) data, representing the slope height of a segment (if the segment is sloped), from the pattern data are stored directly in the FIFO 160.

The analog circuitry for writing a polygon also requires the cumulative, or running, total of length (L) as the polygon is written. The length L is calculated by adding the value of dL for the next segment to the total each time a segment is completed. The pattern data is supplied to an adder circuit 162, the output of which is stored in a register 164. The output of the register 164 is stored in the FIFO 160 and is also connected to the other input of the adder 162. Each time a new value of segment length dL is received in the pattern data, it is added to the length L stored in the register 164. The values of segment length dL and total length L are illustrated with reference to FIG. 4A. The segment length dL of the segment de is the horizontal distance between points d and e. The total length L at the segment de is the horizontal distance between points $x_p$ and e.

Similarly, the segment processor calculates a running, or cumulative, total of height H for each segment. The height H is determined by adding the values of step height and slope height dH for the next segment to the previously calculated total. The pattern data is supplied to an adder 166, the output of which is stored in a register 168 and is connected to one input of a multiplexer 170. The output of the register 168 is supplied to the other input of the multiplexer 170 and is also connected to the other input of the adder 166. The output of the multiplexer 170 is connected to the FIFO 160. The multiplexer 170 insures that the height H stored in the FIFO represents the correct height of the segment by adding the step height at the beginning of the segment and adding slope height dH at the end of the segment.

The output of the FIFO 160 is controlled by a control 172, which receives control signals from the analog circuitry. Each time the writing of a segment is completed, the control 172 receives a turn point pulse, UP TURNPT or LO TURNPT, as shown in FIGS. 4G and 4I, indicating that data for the next segment is to be strobed to the FIFO 160 output. The digital circuitry in the pattern generator 86 typically utilizes emitter coupled logic (ECL) for high speed. In addition, the FIFO 160 uses a parallel arrangement to insure high speed operation. The A and B sections of the FIFO 160 have outputs coupled to a temporary storage register 174, which contains A and B sections for each data type (dL, dH, H, L). The outputs of the register 174 are coupled to a multiplexer 176 having regions for each data type. The A and B FIFO 160 sections alternate read and write memory operations so that segment data can be supplied essentially continuously. The multiplexer 176 alternately selects segment data from the A and B sections of the register 174 so that no waiting is required for FIFO 160 read and write operations.

Figure 7:
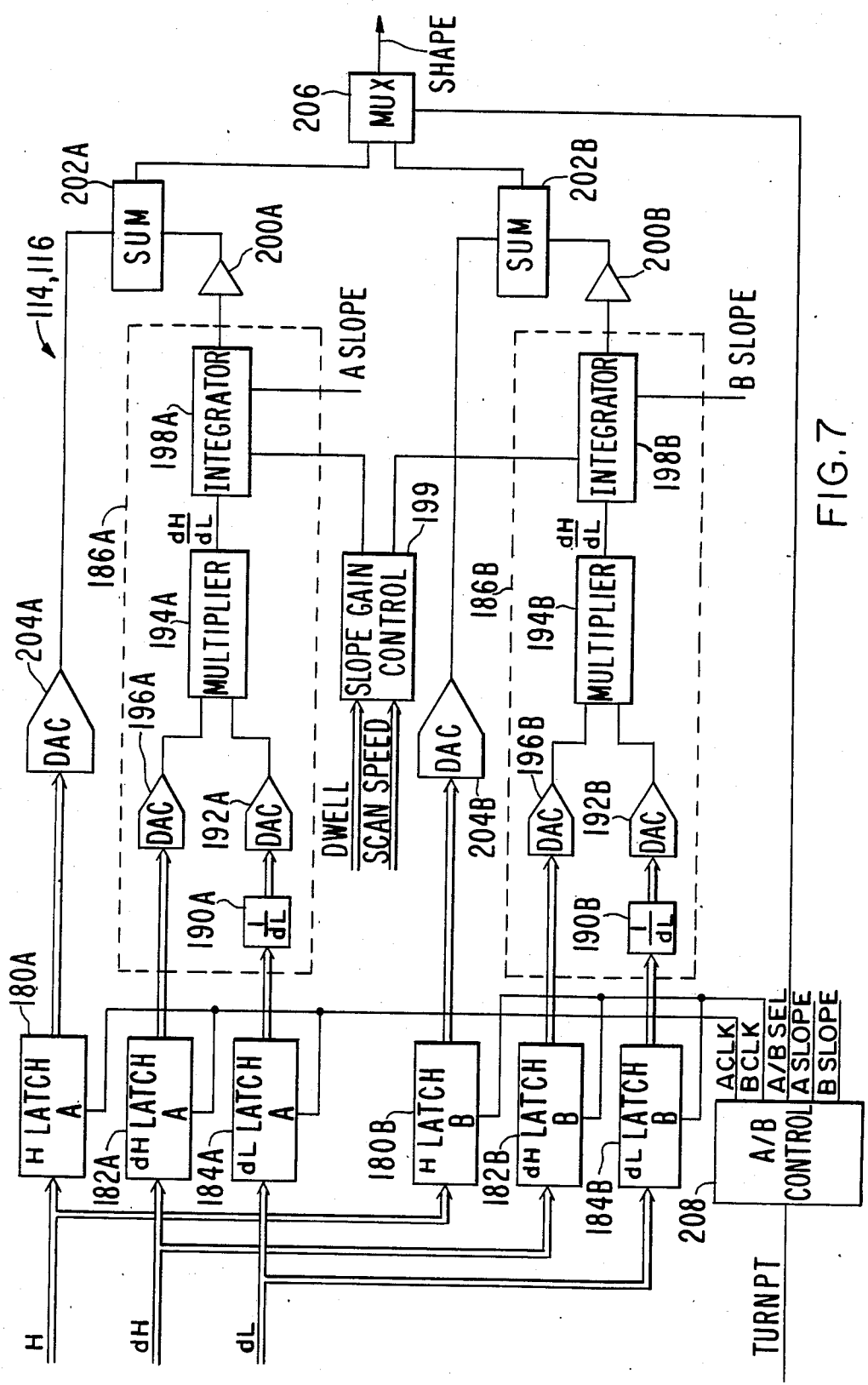
FIG. 7 is a block diagram of the shape generator shown in FIG. 5.

A block diagram of the shape generators 114, 116 is shown in FIG. 7. As noted above, the pattern generator is required to operate at very high speed to insure that writing can proceed without the necessity of waiting for data processing. A preferred embodiment of the shape generator shown in FIG. 7 includes two identical shape generator circuits referenced as A and B. These circuits are interleaved, or time-multiplexed, in operation. The A and B sections of the shape generator provide the signals for alternating segments of the polygon. For example, the A section of upper shape generator 114 supplies signals for segments $x_p a$, bc and de, while the B section supplies signals for segments ab, cd and ef. During the periods between alternating segments, the A and B sections perform the necessary processing of data. Thus, there is no delay between segments due to data processing times or settling times.

The shape generator includes latches 180A, 180B for storing polygon height H data, latches 182A, 182B for storing segment slope height dH data and latches 184A, 184B for storing segment length dL data. The latches 180A, 180B, 182A, 182B, 184A, 184B receive data from the respective outputs of the segment processors 110, 112. Data for two consecutive segments is stored in the A and B sections of the latches. The outputs of the latches 182A, 184A and the latches 182B, 184B are coupled to slope generators 186A, 186B, respectively. The slope generators 186A, 186B generate the sloped segments of the polygon, such as segments mn and bc in FIG. 4A. The slope segment signals are generated by dividing the slope height dH by the segment length dL and then integrating the value of dH/dL. The values of dL are supplied to dividers 190A, 190B, which calculate the values of 1/dL. In a preferred embodiment, the dividers 190A, 190B are implemented as a look-up table. Each value of dL addresses a memory location where there is stored the reciprocal value of dL. The look-up table embodiment provides extremely high speed operation. It will be understood that other implementations of a divider circuit can be utilized. The outputs of the dividers 190A, 190B are coupled through DAC's 192A, 192B to one of the inputs of multipliers 194A, 194B, respectively. The outputs of the slope height dH latches 182A, 182B are coupled through DAC's 196A, 196B to the other inputs of the multipliers 194A, 194B. The outputs of the multipliers 194A, 194B represent the values of dH/dL for respective slope segments. The calculated slopes dH/dL are then integrated by integrators 198A, 198B to provide ramp signals having the required slope. The gains of the integrators 198A, 198B are adjusted by a slope gain control 199, to correspond to the sweep rate for the polygon being written.

The outputs of the slope generators 186A, 186B are coupled through transconductance amplifiers 200A, 200B to the inputs of summing circuits 202A, 202B, respectively. The outputs of the height H latches 180A, 180B are coupled through DAC's 204A, 204B to the other inputs of the summing circuits 202A, 202B. The outputs of the summing circuits 202A, 202B are connected to the inputs of a multiplexer 206. The multiplexer 206 and the A and B sections of the shape generator are controlled by an A/B control 208 logic unit. The A/B control 208 receives a turn point pulse each time the writing of a segment is completed. The A/B control 208 controls the multiplexer 206 so as to alternate between A and B sections of the shape generator. The A/B control 208 clocks new data into the latches 180A, 182A, 184A or the latches 180B, 182B, 184B when writing of a segment is completed. Therefore, signals for a new segment are ready when the unit switches from one section to the other. In addition, the integrators 198A, 198B are enabled to generate a slope precisely at the beginning of the segment writing process.

Figure 8:
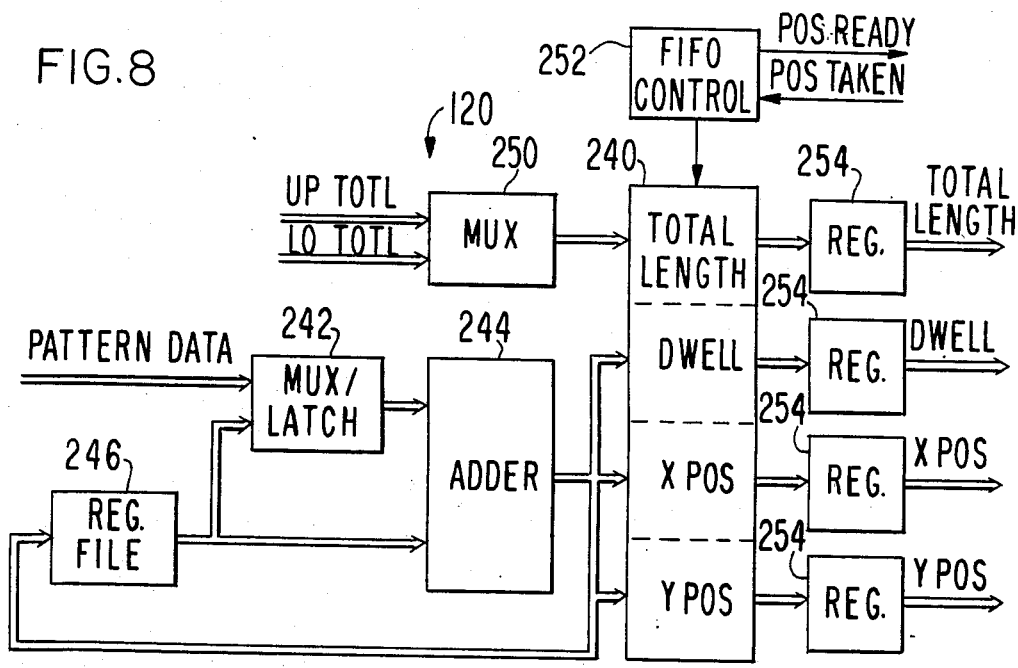
FIG. 8 is a block diagram of the position and array processor shown in FIG. 5.

The position and array processor 120 is shown in block diagram form in FIG. 8. A FIFO 240 buffer register stores, in separate sections, the x-position, the y-position, the dwell and the total length of each polygon. The dwell prescribes the speed at which the polygon is to be scanned. A relatively high scan rate results in a lower electron dosage, and vice versa. The dwell specified for each polygon is the mechanism for proximity effect correction. Pattern data from the pattern memory 84 is supplied to one input of a multiplexer-latch 242 which stores a selected input. The output of the multiplexer-latch 242 is connected to one input of an adder 244. The output of the adder 244 is coupled to the dwell, y-position and x-position sections of the FIFO 240. The output of the adder 244 is also coupled to the input of a register file 246. The output of the register file 246 is coupled to the other input of the multiplexer-latch 242 and to the other input of the adder 244. The arrangement of the multiplexer latch 242, the adder 244 and the register file 246 is used to position the elements of arrays, as described below.

In the case of simple polygons, the pattern data passes through the multiplexer-latch 242 and the adder 244 without modification and is stored in the appropriate section of the FIFO 240. The segment processors 110, 112, in calculating the upper and lower lengths of each polygon, also determine an upper total length (UP TOTL) and a lower total length (LO TOTL). These values represent the maximum lengths of the upper and lower edges, respectively, of the polygon. UP TOTL and LO TOTL are supplied to a multiplexer 250 in the position and array processor 120. The output of the multiplexer 250 is connected to the total length section of FIFO 240. The larger of UP TOTL and LO TOTL is the total length of the polygon and is stored in the FIFO 240.

As noted previously, an array is specified by an initial position $x_{pa}$, $y_{pa}$, element spacings, delta x and delta y and array size nx, ny. For example, a 8×6 array of elements might have x direction spacing of 6 micrometers and y direction spacing of 4 micrometers. When an array is specified by the pattern data, the values of $x_{pa}$, $y_{pa}$, delta x, delta y, nx and ny are stored in the register file 246. As writing of the array proceeds along one row in the x direction, the value of x-position is incremented by 6 micrometers after each polygon is completed. When 8 polygons have been completed, the y-position is incremented by 4 micrometers; and the x-position is decremented to its initial value. The next row of the array is written in the same manner as the first. This process is repeated until 6 rows of polygons have been written, thereby completing the array. The incrementing of x and y positions, up to the prescribed extent of the array, is performed by the combination of the register file 246, the multiplexer latch 242 and the adder 244.

The loading and unloading of the FIFO 240 is controlled by a FIFO control 252. The outputs of the FIFO 240 are supplied through registers 254. A POSITION READY signal from the FIFO control 252 indicates that the x, y position of a new polygon is ready. After the position has been accepted by the pattern generator circuitry, a POSITION TAKEN signal indicates that new data can be clocked to the output.

Figure 9:
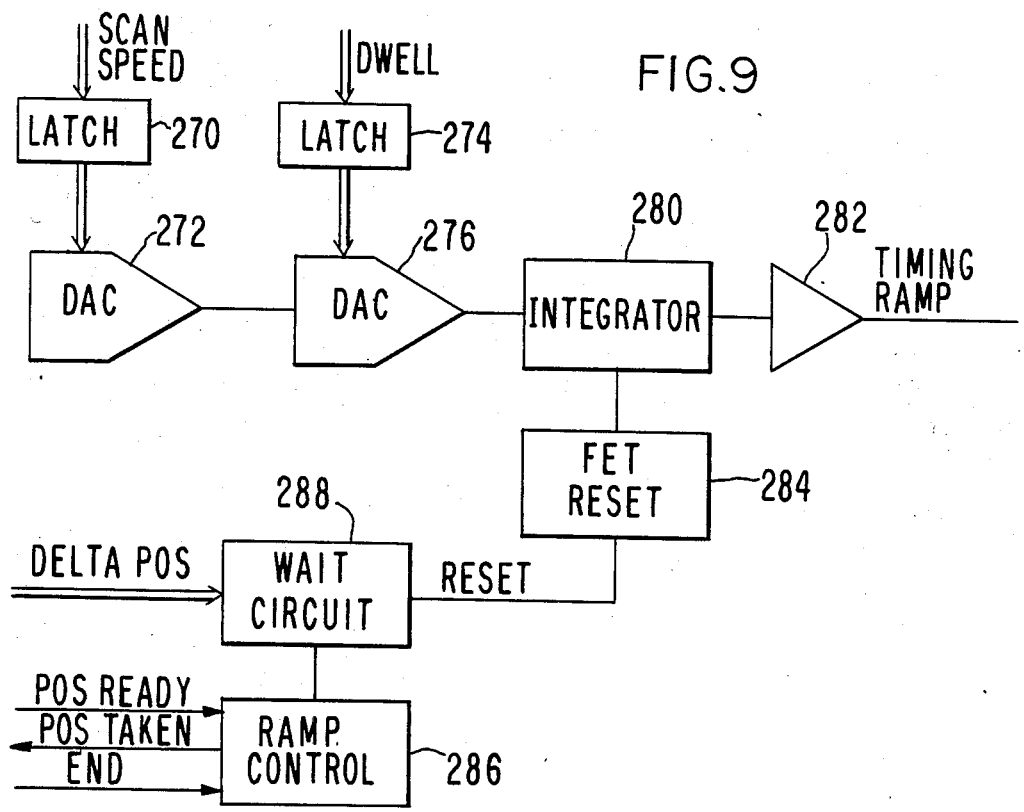
FIG. 9 is a block diagram of the ramp generator shown in FIG. 5.

The ramp generator 136 is shown in more detail in FIG. 9. The TIMING RAMP output of the ramp generator 136 sweeps the variable length line beam across each polygon of the complete pattern. The sweep rate is controllable to accommodate electron beam resists with differing sensitivities and to accomplish proximity effect correction. The base scan speed, which is typically variable over a 10 to 1 range, is a set-up parameter received from the write controller 88. The selected scan speed is stored in a latch 270 and is converted to analog form by a DAC 272. The dwell is derived from the proximity effect correction process and provides variations about the selected scan speed. The dwell can vary from polygon to polygon. The dwell input received from the position and array processor 120 is stored in a latch 274 and is converted to analog form by a DAC 276. The scan speed output of the DAC 272 is supplied to the DAC 276 so that the scan speed and dwell are added to provide a composite sweep rate. The output of the DAC 276 is supplied to an integrator 280, which is typically an operational amplifier utilizing a capacitor in the feedback loop. The integrator 280 integrates the composite sweep rate to provide a ramp output, the slope of which is proportional to the desired sweep rate. The output of the integrator 280 is supplied through an amplifier 282.

Synchronization of the TIMING RAMP with the remainder of the pattern generator circuitry is controlled by an FET reset circuit 284 which holds the integrating capacitor in the integrator 280 in a discharged state until the required time for sweeping a polygon. A POSITION READY signal from the position and array processor 120 is supplied to a ramp control 286. The POSITION READY signal indicates that the x and y position of a polygon are available at the output of the position and array processor 120. A signal for enabling the integrator 280 is supplied by the ramp control 286 through a wait circuit 288 to the FET reset 284. The wait circuit 288 introduces a variable delay to the signal which enables the integrator 280. The delay compensates for settling times in the x, y position DAC's and the main deflection coils of the electron beam column 10. The wait circuit 288 receives a delta position input which indicates the magnitude of the position change between successive polygons. Larger settling times are required for relatively large position changes. Therefore, the delay is scaled to insure that the beam is properly positioned before sweeping of the polygons begins. An END signal supplied from the blanking circuit 150 to the ramp control 286 indicates that the polygon is complete and causes the TIMING RAMP to be reset.

Figure 10:
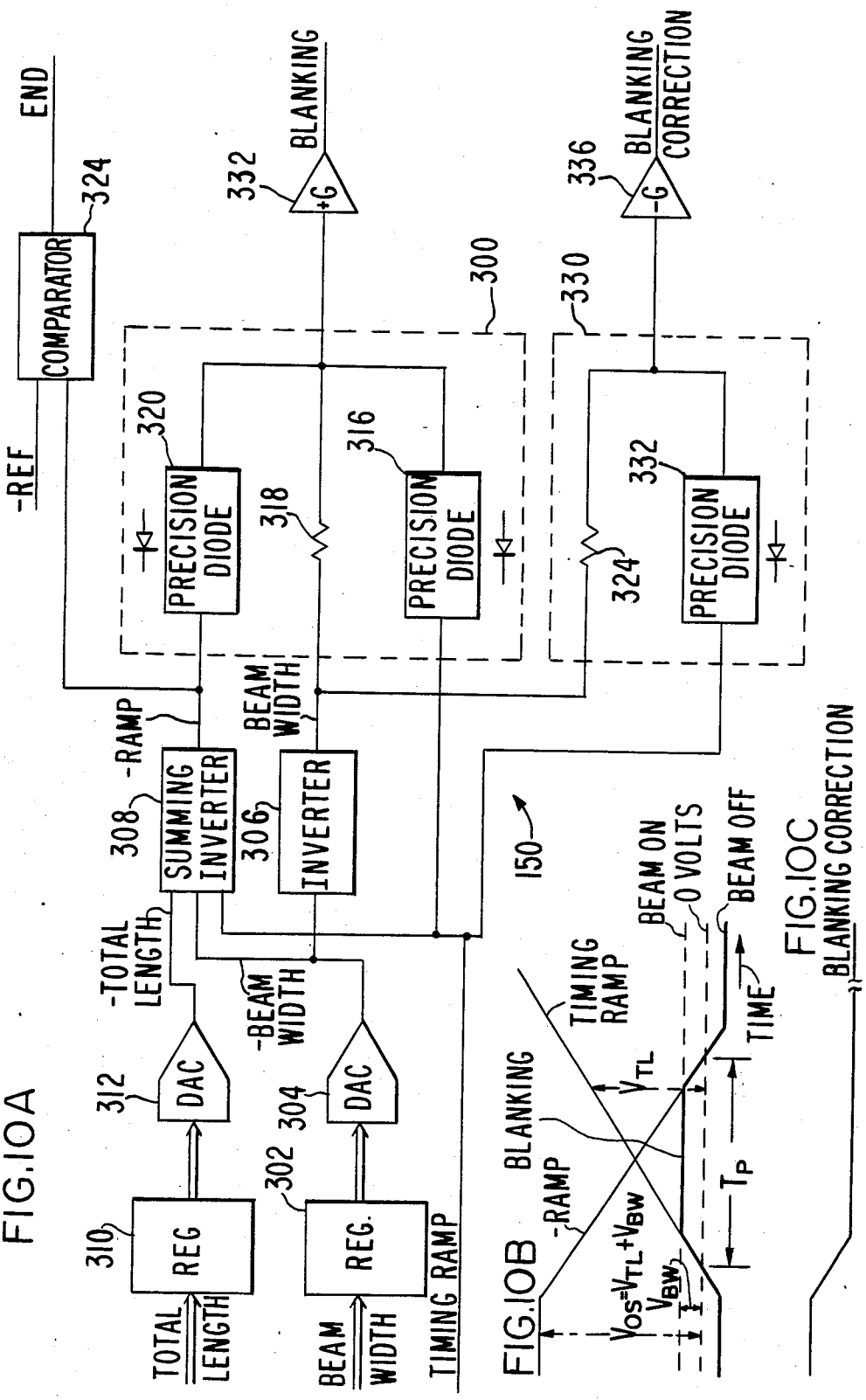
FIGS. 10A–10C illustrate the blanking circuit shown in FIG. 5 and associated waveforms.

A block diagram of the blanking circuit 150 is shown in FIG. 10A, while waveforms associated with the blanking circuit 150 are shown in FIGS. 10B and 10C. Signals associated with the blanking circuitry are superimposed in FIG. 10B for ease of understanding. Blanking is accomplished in the system of the present invention by applying the appropriate voltages to the shaping deflector 38 in the electron beam column 10. As shown in FIG. 3C, the first aperture image 60 is shifted relative to the second aperture 44 so that the electron beam cannot pass. For a vertical line beam, the BLANKING signal shown in FIG. 10B is applied to the x-axis shaping deflector 38x. The zero volt level represents the point at which the edge of the first aperture image 60 and the second aperture 44 coincide. When the beam-on level is applied to the shaping deflector 38x, the portion of the beam 62, as shown in FIGS. 3A and 3B, passes through the second aperture 44. The magnitude of the beam-on voltage determines the width of the line beam 62. When a larger voltage is applied to the shaping deflector 38x, the first aperture image 60 is shifted more to the right (FIG. 3B); and the line beam 62 is wider. The beam-off voltage, shown in FIG. 10B, is negative to insure that during blanking, the first aperture image 60 and the second aperture 44 are separated by a finite distance to avoid passage of electrons at the edges of the beam through the second aperture 44.

The beam is turned on only during exposure of polygons. At the beginning and end of each polygon, the BLANKING signal is ramped on and off, respectively, to insure uniform exposure of pattern edges. If the BLANKING signal is stepped on, rather than ramped, a ramped exposure level occurs at pattern edges. Furthermore, to achieve uniformity, the slope of the ramped BLANKING signal must match the slope of the sweep voltage. As discussed hereinabove, the sweep rate in the present system is variable to accommodate resist sensitivities and proximity effect correction. The BLANKING signal can be derived from the TIMING RAMP which sweeps the electron beam across each polygon. The ramp-on portion of the BLANKING signal utilizes the TIMING RAMP directly. When the prescribed beam-on voltage is reached, the BLANKING signal is clamped to the beam-on voltage. The ramp-off portion of the BLANKING signal is the TIMING RAMP inverted and offset (−RAMP) The −RAMP is obtained by inverting the TIMING RAMP and adding a dc voltage offset $V_{OS}$ equal to $V_{TL}+V_{BW}$, where $V_{TL}$ is the TIMING RAMP voltage at the completion of the polygon, and $V_{BW}$ is the voltage which determines the width of the line beam. The time required to scan a polygon is the period $T_p$ between the time when the BLANKING signal crosses zero and the time when the BLANKING signal begins to ramp down. The value of $V_{OS}$ added to the inverted ramp insures that −RAMP reaches $V_{BW}$ when the polygon has been completed. The −RAMP signal is the ramp-off portion of the BLANKING signal.

A circuit for generating the BLANKING signal is shown in FIG. 10A. The TIMING RAMP from the ramp generator 136 is supplied to a clamp circuit 300. Beam width, a set-up parameter from the write controller 88, is supplied to a register 302. The value in the register 302 is converted to an analog voltage by a DAC 304. The output of the DAC 304, which represents inverted beam width, is supplied through an inverter 306 to an input of the clamping circuit 300 and to an input of a summing inverter 308. The value of the total length of the polygon is supplied by the position and array processor 120 to a register 310. The value stored in the register 310 is converted to an analog voltage by a DAC 312. The output of the DAC 312, which represents inverted total length, is supplied to an input of the summing inverter 308. The TIMING RAMP is also supplied to the summing inverter 308. The output of the summing inverter 308 is the −RAMP signal shown in FIG. 10B and is supplied to an input of the clamping circuit 300. The clamping circuit 300 utilizes precision diode circuits which have nearly ideal rectifying characteristics. The clamping circuit 300 reference voltage is the voltage representing beam width ($V_{BW}$ in FIG. 10B). The TIMING RAMP is supplied through a precision diode 316 to the output of the clamping circuit 300. The beam width voltage is supplied through a resistor 318 to the output, while the −RAMP signal is supplied through a precision diode 320 to the output.

Initially, −RAMP is at a high value, as shown in FIG. 10B; and the precision diode 320 is biased off. The TIMING RAMP is at a low value initially, and the precision diode 316 is biased on. Thus, the output follows the TIMING RAMP until the beam width voltage is reached. At this point, the precision diode 316 is turned off; and the BLANKING signal remains at the beam width voltage, as shown in FIG. 10B. At the end of the polygon, the −RAMP signal reaches and goes below the beam width voltage and biases the precision diode 320 on. The BLANKING signal then follows −RAMP until the beam-off level is reached and the TIMING RAMP is reset. The output of the clamp circuit 300 is supplied through an amplifier 322. The −RAMP signal is connected to a comparator 324 which compares the −RAMP with a negative reference voltage. When the −RAMP reaches the negative reference, the comparator 324 provides an END signal indicating that writing of the polygon is complete.

The necessity for a BLANKING CORRECTION signal arises from the fact that, during the ramp-on portion of the BLANKING signal, the BLANKING signal and the TIMING RAMP sweep voltage both act on the electron beam to produce a double rate deflection. This effect does not occur during the ramp-off portion of the BLANKING signal, since the deflections applied to the beam oppose each other. The BLANKING CORRECTION signal shown in FIG. 10C is the inverse of the ramp-on portion of the BLANKING signal and is applied to the correcting deflector 48x, in the case of a vertical line. The effect of the correction is to offset the increased sweep speed during the ramp-on portion of the BLANKING signal. The BLANKING CORRECTION signal is derived from the TIMING RAMP by a clamping circuit 330. The TIMING RAMP is coupled through a precision diode 332 to the output of the clamping circuit 330. The beam width voltage is coupled through a resistor 334 to the output. The clamping circuit 330 operates in a manner similar to that described hereinabove in connection with the clamping circuit 300. The output of the clamping circuit 330 follows the TIMING RAMP until the beam width voltage is reached. The output is thereafter clamped at the beam width voltage. The output of the clamping circuit 330 is coupled through an inverting amplifier 336 to provide the BLANKING CORRECTION signal of correct polarity.

Figure 11:
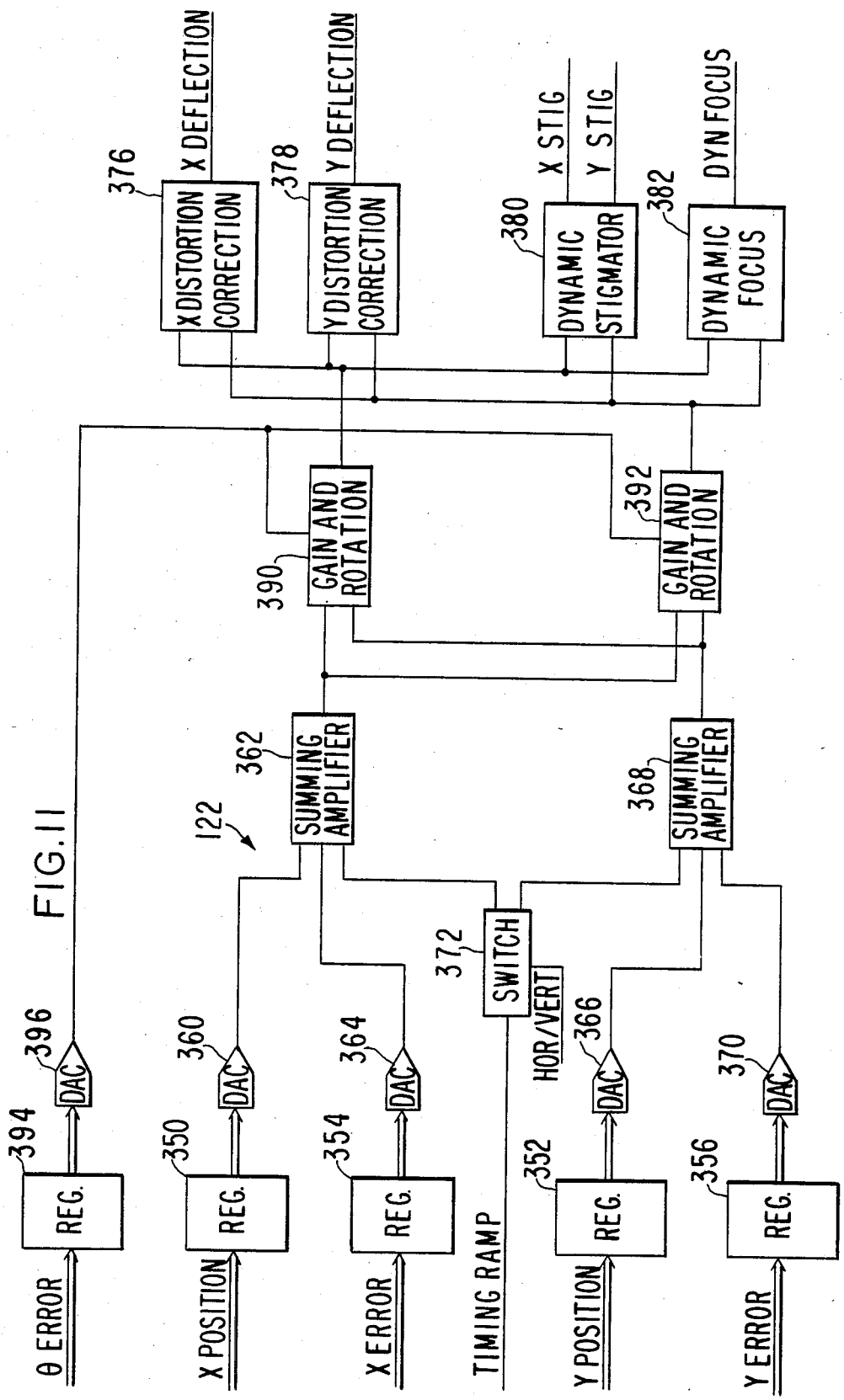
FIG. 11 is a block diagram of the xy placement controller shown in FIG. 5.

A block diagram of the xy placement controller 122 is shown in FIG. 11. The X-POSITION and the Y-POSITION signals from the position and array processor 120 are stored in registers 350 and 352, respectively. The X ERROR and Y ERROR signals from the stage controller 92 are stored in registers 354 and 356, respectively. The output of the register 350 is converted to an analog voltage by a DAC 360 and is supplied to an input of a summing amplifier 362. The output of the register 354 is converted to an analog voltage by a DAC 364 and is supplied to another input of the summing amplifier 362. The output of the register 352 is converted to analog form by a DAC 366 and is supplied to an input of a summing amplifier 368. The output of the register 356 is converted to analog form by a register 370 and is supplied to another input of the summing amplifier 368. The TIMING RAMP signal from the ramp generator 136 is supplied to the input of an analog switch 372. The TIMING RAMP signal, under the control of a HORIZONTAL/VERTICAL signal from the position and array processor 120, is switched either to the x-axis summing amplifier 362 or the y-axis summing amplifier 368. The summing amplifier 362 adds the nominal X-POSITION and the X ERROR, while the summing amplifier 368 adds the nominal Y-POSITION and the Y ERROR. In addition, the TIMING RAMP is added to either the x or y position by one of the summing amplifiers 362, 368 to sweep the line beam from the initial position across the area of the polygon.

The outputs of the summing amplifiers 362, 368 are coupled to inputs of gain and rotation circuits 390, 392. The $\theta$ ERROR signal from the stage controller 92 is stored in a register 394. The output of the register 394 is converted to analog form by a DAC 396 and is supplied to the gain and rotation circuits 390, 392. The circuits 390, 392 incorporate the rotation error and a gain factor into the X and Y DEFLECTION signals.

The outputs of the gain and rotation circuits 390, 392 are supplied to an x distortion correction circuit 376, a y distortion correction circuit 378, a dynamic stigmator circuit 380 and a dynamic focus circuit 382. The distortion correction circuits 376, 378 alter the x, y position of the electron beam, in accordance with predetermined algorithms, to compensate for distortions and errors in the electron optical column 10. The X DEFLECTION signal from the correction circuit 376 and the Y DEFLECTION signal from the correction circuit 378 are supplied to the main deflection coils 50 in the electron beam column 10. The dynamic stigmator 380 supplies X STIG and Y STIG signals to stigmator coils in the column 10 for astigmatism correction. The dynamic focus circuit 382 supplies a DYNAMIC FOCUS signal to dynamic focus coils in the electron beam column 10 for dynamic focus correction, as the pattern is written.

In operation, the pattern data file for the level of the wafer or mask being written is transferred from the pattern disc 82 to the pattern memory 84. Necessary initial parameters, such as workpiece size, pattern extent, resist type, beam width, scan speed, etc., are set up. When the system is ready to begin exposure, or writing, of the pattern, pattern data is transferred from the memory 84 to the pattern generator 86, one byte at a time. Polygon data is processed by the segment processors 110, 112 and by the position and array processor 120, as described hereinabove, and is stored in the respective FIFO's. After the data for a polygon has been completed, writing can begin. Processing of pattern data continues, and polygon data is stored in serial fashion in the segment processor FIFO's and the position and array FIFO's. This insures that data is available for continuous writing.

When polygon data is ready and the electron beam is positioned at the prescribed x, y polygon position on the workpiece, the TIMING RAMP is initiated by the POSITION READY signal. The TIMING RAMP causes sweeping of the line beam over the area of the polygon. The TIMING RAMP also initiates a BLANKING signal which turns on the electron beam. The upper and lower shape generators 114, 116 generate the upper and lower shapes, respectively, of the polygon simultaneously with sweeping of the beam by the TIMING RAMP. The shaping signals vary the length and position of the line beam during sweeping of the polygon. Turn points in the polygon are detected by the compare circuits 142, 144; and new segment data is clocked into the upper and lower shape generators 114, 116. When exposure of the polygon has been completed, as determined from the TOTAL LENGTH signal, the beam is blanked off, the TIMING RAMP is reset, and the next x, y polygon position is supplied to the xy placement controller 122. Subsequent polygons are written in the same fashion. The stage 20 moves the workpiece in a serpentine pattern until the entire workpiece surface has been covered. The pattern data is processed at the same average rate as writing of patterns. Therefore, no delay is necessary for pattern data processing.

While there has been shown and described what is at present considered the preferred embodiments of the invention, it will be obvious to those skilled in the art that various changes and modifications may be made therein without departing from the scope of the invention as defined by the appended claims. For example, the control apparatus described herein can be utilized with other types of charged particle beams, such as an ion beam.

We claim:

1. Apparatus for controlling charged particle beam irradiation of a workpiece for high speed writing of a polygon represented by data specifying a polygon location, size and shape, said appratus comprising:
   means for generating a charged particle beam having a rectangular cross-section, including means for varying the cross-section and position of said rectangular beam;
   means for converting said polygon location data to deflection voltages for positioning said rectangular beam at said polygon location;
   means for generating a ramp signal for sweep deflection of said rectangular beam over said polygon; and
   means for converting said polygon size and shape data to shaping signals for dynamically varying the cross-section and position of said rectangular beam during sweep deflection in accordance with the size and shape of said polygon so that said beam uniformly irradiates an area of said workpiece having the location, size and shape of said polygon, said polygon being defined by a series of interconnecting segments which form an upper shape and a lower shape of said polygon, each of said segments being defined by segment data including segment length, slope height and step height, said means for converting said polygon data to shaping signals including means for converting segment data to a line length signal for controlling the length of said rectangular beam and a line position signal for controlling the position of said rectangular beam during sweep deflection thereof, said means for converting said polygon data to shaping signals including
   upper segment processor means for generating upper turn point locations for the segments in said upper shape relative to an initial position of said polygon, from said segment data,
   upper shape generator means for generating an upper shape signal corresponding to the upper shape of said polygon, from said upper turn point locations, said segment lengths and slope heights,
   lower segment processor means for generating lower turn point locations for the segments in said lower shape relative to the initial positive of said polygon, from said segment data,
   lower shape generator means for generating a lower shape signal corresponding to the lower shape of said polygon, from said lower turn point locations, said segment lengths and slope heights, and
   means for subtracting said upper shape signal and said lower shape signal to provide said line length signal, said line position signal corresponding to one of said upper shape signal and said lower shape signal.

2. The apparatus as defined in claim 1 further including means for blanking said rectangular beam except during irradiation of said polygon and wherein said upper and said lower segment processor means determine the total length of said polygon for controlling said blanking means.

3. The apparatus as defined in claim 1 wherein said upper segment processor means and said lower segment processor means each include means for adding segment length to a running total of polygon length and means for adding step height and slope height to a running total of polygon height for determining upper and lower turn point locations as said polygon is being written.

4. The apparatus as defined in claim 1 wherein said upper segment processor means and said lower segment processor means each include parallel-connected A and B first-in first-out buffer register sections for temporary storage of segment data and multiplexer means coupled to the outputs of said A and B buffer register sections for high speed interleaved readout of the segment data.

5. Apparatus for high speed charged particle beam lithography exposure of a polygon pattern feature at a prescribed location on a workpiece, said polygon comprising a plurality of interconnected turn points, said apparatus comprising:
   means for generating a charged particle beam having a rectangular cross-section, including means for varying the length and position of said rectangular beam;
   means for generating x, y position signals for positioning said rectangular beam at an initial polygon location;
   means for generating a ramp signal for sweep deflection of said rectangular beam over said polygon;
   means for generating shaping signals for controlling the length and position orthogonal to the sweep direction of said rectangular beam during sweep deflection of said rectangular beam over said polygon;
   means for generating successive turn point voltages representing the location of the next turn point as said rectangular beam is swept over said polygon; and means for generating turn point control signals for controlling said shaping signal means each time said ramp signal equals a turn point voltage, said means for generating turn point voltages including means for deriving upper and lower turn point voltages from pattern data describing said polygon, said upper and lower turn point voltages corresponding to turn point locations on the upper and lower portions, respectively, of said polygon, relative to the initial location of said polygon, said means for generating turn point control signals including first comparator means for comparing said upper turn point voltages with said ramp signal and generating upper turn point control signals each time said upper turn point voltage equals said ramp signal, and second comparator means for comparing said lower turn point voltages with said ramp signal and generating lower turn point control signals each time said lower turn point voltage equals said ramp signals, wherein said upper and said lower turn point control signals are synchronized in time and location with the sweep deflection of said rectangular beam over said polygon.

6. The apparatus as defined in claim 5 wherein said means for generating a ramp signal includes programmable means for varying the slope of said ramp signal so as to vary the rate of sweep deflection of said rectangular beam over said polygon.

7. The apparatus as defined in claim 6 wherein said means for generating a ramp signal further includes means for holding said ramp signal reset until said rectangular beam is positioned at said initial polygon location for exposure.

8. The apparatus as defined in claim 7 wherein said means for holding said ramp signal reset includes programmable delay means for delaying the start of said ramp signal after said rectangular beam is positioned.

9. Apparatus for high speed charged particle beam lithography exposure of a polygon pattern feature at a prescribed position on a workpiece comprising:

a charged particle beam column including means for forming a charged particle beam having a rectangular cross-section, first means responsive to a first shaping signal for varying the length of said rectangular beam, second means responsive to a second shaping signal for high speed positioning of said rectangular beam during exposure of a polygon and third means responsive to positioning signals for large scale positioning and sweeping of said rectangular beam on said workpiece;

means for generating said positioning signals including means for generating polygon position signals and means for generating a sweep signal for sweeping said rectangular beam over the area of said polygon; and means for generating said first and second shaping signals synchronized with said sweep signal including means for generating an upper shape signal corresponding to the upper shape of said polygon, means for generating a lower shape signal corresponding to the lower shape of said polygon, and means for obtaining the difference between said upper and said lower shape signals, said first shaping signal corresponding to said difference and said second shaping signal corresponding to one of said shape signals.

10. The apparatus as defined in claim 9 wherein said upper and said lower shape signals are derived by said means for generating upper and lower shape signals respectively, from sequentially supplied data describing the height, slope height and length of each segment comprising the upper and lower shapes of said polygon.

11. The apparatus as defined in claim 10 wherein said means for generating an upper shape signal shape generator and said means for generating a lower shape signal each comprise parallel-connected A and B shape generator sections for time-shared operation and shape control means for alternating outputs of said A and B sections during exposure of successive segments of said shapes.

12. Apparatus for high speed charged particle beam lithography exposure of a polygon pattern feature at a prescribed position on a workpiece comprising:

a charged particle beam column including means for forming a charged particle beam having a rectangular cross-section, first means responsive to a first shaping signal for varying the length of said rectangular beam, second means responsive to a second shaping signal for high speed positioning of said rectangular beam during exposure of a polygon and third means responsive to positioning signals for large scale positioning and sweeping of said rectangular beam on said workpiece;

means for generating said positioning signals including means for generating polygon position signals and means for generating a sweep signal for sweeping said rectangular beam over the area of said polygon; and means for generating said first and second shaping signals synchronized with said sweep signal including means for generating an upper shape signal corresponding to the upper shape of said polygon, means for generating a lower shape signal corresponding to the lower shape of said polygon, and means for obtaining the difference between said upper and said lower shape signals, said first shaping signal corresponding to said difference and said second shaping signal corresponding to one of said shape signals, said upper and said lower shape signals being derived by said means for generating upper and lower shape signals, respectively, from sequentially supplied data describing the height, slope height and length of each segment comprising the upper and lower shapes of said polygon, said means for generating an upper shape signal and said means for generating a lower shape signal each comprising parallel-connected A and B shape generator sections for time-shared operation and shape control means for alternating outputs of said A and B sections during exposure of successive segments of said shapes, said A and B sections of said means for generating upper and lower shape signals each including slope generator means for generating sloped segment signals from said segment length data and said slope height data, means for converting segment height data to segment height signals and means for adding said sloped segment signals and said segment height signals to provide composite segment signals.

13. The apparatus as defined in claim 12 wherein said slope generator means each include divider means for dividing said slope height by said segment length to provide a slope value and integrator means for integrating said slope value to provide said sloped segment signal.

14. The apparatus as defined in claim 13 wherein said divider means comprises a look-up table memory unit which provides at its output the reciprocal value of segment length for each segment length input and a multiplier which multiplies the reciprocal value of segment length and the slope height to provide said slope value.

15. The apparatus as defined in claim 13 wherein said slope generator means includes programmable means for varying the slope of said sloped segment signal to correspond to the rate of said sweep signal.

16. Apparatus for high speed charge particle beam lithography exposure of a polygon pattern feature on a workpiece comprising:
    means for generating a charged particle beam having a rectangular cross-section, including means for varying the length, width and position of said rectangular beam;
    means for generating a ramp signal for sweep deflection of said rectangular beam over said polygon at a selectable sweep rate;
    means for generating shaping signals for controlling the length and position orthogonal to the sweep direction of said rectangular beam during sweep deflection of said rectangular beam over said polygon; and
    means for generating an unblanking signal for providing substantially uniform exposure within said polygon by controlling the width of said rectangular beam during said sweep deflection, said means comprising for generating an unblanking signal a first clamping circuit means for increasing said beam width at the sweep rate of said ramp signal until the desired beam width is reached, for maintaining said beam width until said rectangular beam reaches the end of said polygon, and for decreasing said beam width at the sweep rate of said ramp signal until the beam width reaches zero, said means for generating a ramp signal and said means for generating an unblanking signal being coupled to separate deflection elements of said charged particle beam generating means for causing double rate deflection of said beam during turning on of said unblanking signal, and further including unblanking correction means for compensating for said double rate deflection.

17. The apparatus as defined in claim 16 wherein said means includes means for generating unblanking signal for providing a negative ramp signal having a slope equal in magnitude and opposite in polarity to said ramp signal and wherein said first clamping circuit means comprises first precision diode means coupled between the output of said first clamping circuit means and said ramp signal, second precision diode means coupled between said output and said means for providing negative ramp signals and a resistor coupled between said output and said a means for supplying a beam width voltage 18. The apparatus as defined in claim 16 wherein said unblanking correction means comprises means for deflecting said rectangular beam in a direction opposite to the deflection caused by said ramp signal and said unblanking signal and at the rate of said ramp signal.

19. The apparatus as defined in claim 18 wherein said unblanking correction means includes a second clamping circuit means for providing an unblanking correction signal which turns on at a rate equal in magnitude and opposite in polarity from said ramp signal simultaneously with turning on of said unblanking signal.

* * * * *